United States Patent
Clark et al.

(10) Patent No.: US 8,837,230 B1
(45) Date of Patent: *Sep. 16, 2014

(54) CIRCUITS AND METHODS FOR MEASURING CIRCUIT ELEMENTS IN AN INTEGRATED CIRCUIT DEVICE

(71) Applicant: Suvolta, Inc., Los Gatos, CA (US)

(72) Inventors: Lawrence T. Clark, Phoenix, AZ (US); Richard S. Roy, Dublin, CA (US)

(73) Assignee: Suvolta, Inc., Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/072,761

(22) Filed: Nov. 5, 2013

Related U.S. Application Data

(63) Continuation of application No. 13/336,434, filed on Dec. 23, 2011, now Pat. No. 8,599,623.

(51) Int. Cl.
   *G11C 7/00* (2006.01)
   *G01R 31/27* (2006.01)
   *G11C 7/10* (2006.01)

(52) U.S. Cl.
   CPC ............ *G01R 31/275* (2013.01); *G11C 7/1006* (2013.01)

USPC .. 365/189.02; 365/201; 365/198; 365/185.21

(58) Field of Classification Search
   CPC ... G11C 7/1006; G11C 7/1051; G11C 7/1078
   USPC ......................... 365/189.02, 201, 198, 185.21
   See application file for complete search history.

(56) References Cited

U.S. PATENT DOCUMENTS

| | | | |
|---|---|---|---|
| 7,724,000 B2 * | 5/2010 | Grosjean et al. | 324/661 |
| 8,594,958 B2 * | 11/2013 | Lin et al. | 702/65 |

OTHER PUBLICATIONS

U.S. Appl. No. 13/336,434, filed Dec. 23, 2011, parent of the present application.

* cited by examiner

*Primary Examiner* — Connie Yoha

(57) ABSTRACT

A memory circuit device having at least one test element interconnecting memory sections can include at least one first switch coupled to a first memory section between a first node within a tested section and an intermediate node, a test switch coupled between the intermediate node and a forced voltage node, and a second switch coupled between the intermediate node and a second node; wherein the forced voltage node is selectively coupled to receive a forced voltage substantially the same as a voltage applied to the second node, and the second node is coupled to at least a second memory section.

20 Claims, 12 Drawing Sheets

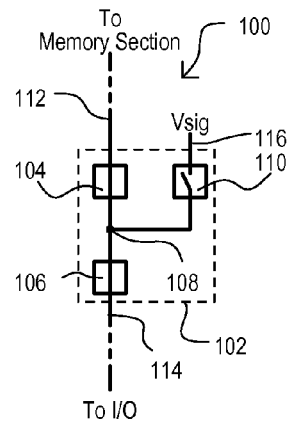
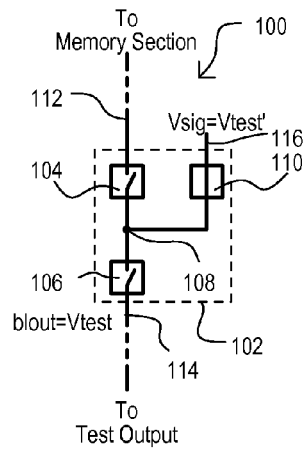
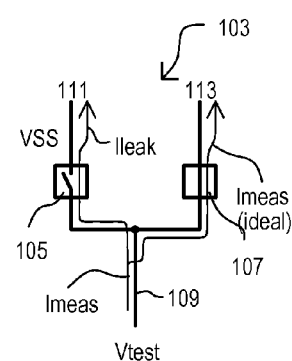
FIG. 1A
FIG. 1B
FIG. 2
(BACKGROUND)
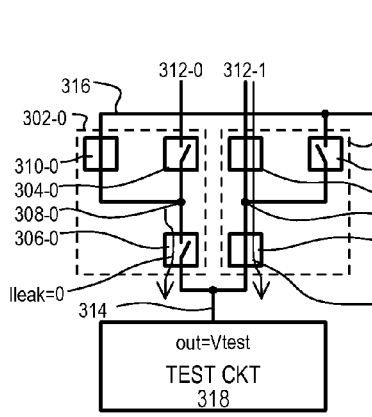
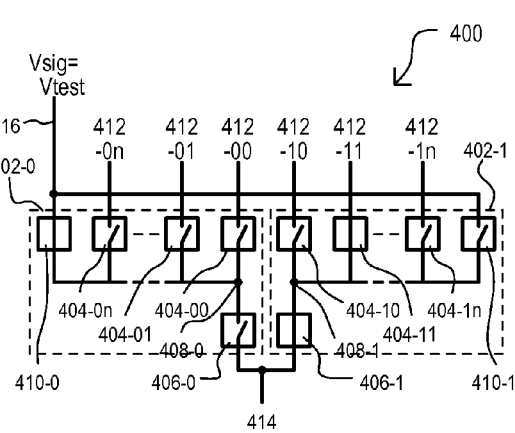
FIG. 3
FIG. 4
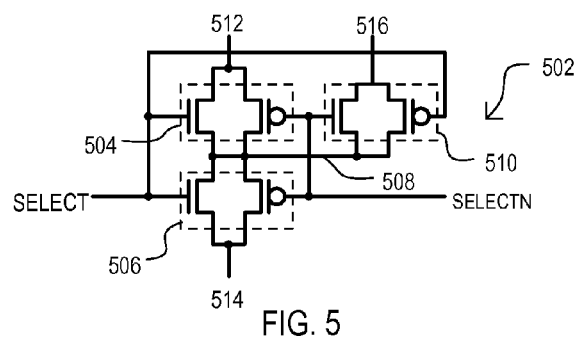
FIG. 5

DSTAN

DSTAP

OFFSET

|        | Read | Write | DBTA | DSTAN | DSTAP | Offset |
|--------|------|-------|------|-------|-------|--------|
| sae    | 0/1  | 0     | 0    | 1     | 0     | 0/1    |
| saen   | 1/0  | 1     | 1    | 1     | 0     | 1/0    |
| ntest  | 0    | 0     | 1    | 1     | 0     | 0      |
| ptestn | 1    | 1     | 0    | 1     | 0     | 1      |
| presan | 0/1  | 0/1   | 1    | 1     | 1     | 1      |
| prebitn| 0/1  | 0/1   | 1    | 1     | 1     | 1      |
| csel   | 0/1  | 0     | 1    | 0     | 0     | 0      |
| dbsel  | 0    | 0     | 1    | 1     | 1     | 1      |
| renable| 0/1  | 0     | 0    | 0     | 0     | 0/1    |
| wenalbe| 0    | 0/1   | 0    | 0     | 0     | 0      |

CIRCUITS AND METHODS FOR MEASURING CIRCUIT ELEMENTS IN AN INTEGRATED CIRCUIT DEVICE

This application is a continuation of U.S. patent application Ser. No. 13/336,434 filed on Dec. 23, 2011, the contents of which are incorporated by reference herein.

TECHNICAL FIELD

The present invention relates generally to integrated circuit devices, and more particularly to test circuits for integrated circuit devices for characterizing transistors therein.

BACKGROUND

Integrated circuit devices can include circuit sections, such as memory circuits, that can be designed for high performance operations. Memory circuits, such as static random access memory (SRAMs) typically have a number of memory cells arranged into one or more arrays composed of multiple transistors. The performance characteristics and yield of the circuit sections in the integrated circuit can be affected by variations in the electrical characteristics of the transistors, such as threshold voltages, current drive, etc., and circuit characteristics, such as offset voltages.

While it is desirable to test transistor characteristics and circuit characteristics within memory cells and other circuit sections of the integrated circuit, data input/output (I/O) paths can introduce leakage currents that can make it very difficult to achieve high fidelity measurements.

BRIEF DESCRIPTION OF THE DRAWINGS

FIGS. 1A and 1B are block schematic diagrams showing an integrated circuit device according to an embodiment.

FIG. 2 is a block schematic diagram of a conventional MUX.

FIG. 3 is a block schematic diagram of an integrated circuit device according to another embodiment.

FIG. 4 is a block schematic diagram of an integrated circuit device according to a further embodiment.

FIG. 5 is a schematic diagram of a test element according to an embodiment.

DETAILED DESCRIPTION

Figure 6A:
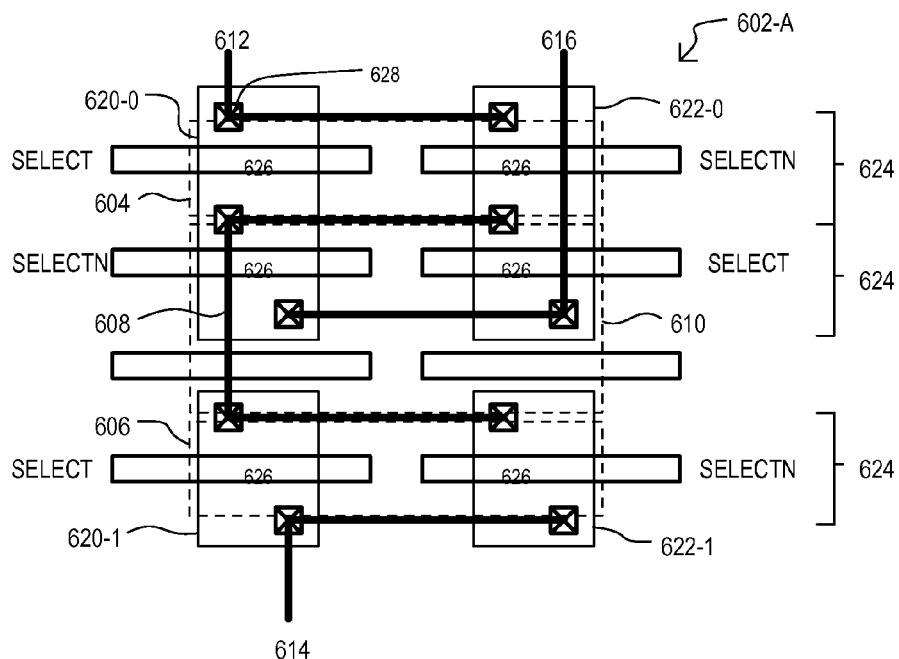
FIGS. 6A and 6B are layouts for a test element according to embodiments.

Various embodiments will now be described in detail with reference to a number of drawings. The embodiments show integrated circuit device test circuits and methods that can reduce leakage currents in a data input/output (I/O) path and thereby enable accurate testing (including characterization) of circuit elements within the device.

In the various embodiments below, like items are referred to by the same reference character but the leading digits corresponding to the figure number.

Referring now to FIGS. 1A and 1B, an integrated circuit (IC) device 100 according to an embodiment is shown in a block schematic diagram. An IC device 100 can include one or more test elements 102. A test element 102 can provide a data path to enable signals to travel to a section of the device (in the embodiment shown a memory section). In addition, a test element 102 can enable low current leakage test paths to enable testing (including characterization) of elements within the section. A test element 102 can include a first switch 104, a second switch 106, and a test switch 110. A first switch 104 can be coupled between a section node 112 and an intermediate node 108. A second switch 106 can be coupled between intermediate node 108 and an output node 114. A test switch 110 can be coupled between intermediate node 108 and a forced voltage node 116. One or more test elements 102 can be used to couple input and output data signals, e.g., test signals, to a circuit under test within the integrated circuit 100. For example, the test element 102 can be used to enable testing and characterization of component transistors or sub-circuits of analog circuit sections in an integrated circuit device, such as a flash analog to digital converter, as well as logic and memory sections.

In some embodiments, a section node 112 can be a node within a memory section of an integrated circuit device. For example, a section node 112 can include any of: a bit line or transistor gate, source, or drain within a selected memory cell. In addition or alternatively, a section node 112 can include nodes within circuits positioned between a memory cell array and input/outputs (I/Os) of a memory section. For example, a memory section node 112 can include any of: a sense amplifier circuit sense node, a transistor within a sense amplifier circuit, or switching circuits in an I/O path (e.g. column multiplexer, column select signals, etc.). It is noted that there can be intervening circuits between a section node 112 and a test element 102. It is also noted that while node 114 is referred to as an "output" node, it can serve to input data to a memory section in some embodiments.

A test element 102 can have two modes of operation, a standard mode and a low leakage cutoff mode. FIG. 1A shows a test element 102 in a standard mode. In a standard mode, first and second switches (104, 106) can be configured to provide a low impedance path, while test switch 110 can be configured to provide a high impedance path. Consequently, a signal path can be enabled between memory section node 112 and output node 114. At the same time, forced voltage node 116 can be isolated from intermediate node 108.

FIG. 1B shows a test element 102 in a low leakage cutoff mode. In a low leakage cutoff mode, first and second switches (104, 106) can be configured to provide a high impedance path. However, a test switch 110 can be configured into a low impedance state. Output node 114 can be driven to a test voltage Vtest, while forced voltage node 116 can be driven to a voltage Vtest', which can be the same as Vtest, or substantially the same. In such an arrangement, output node 114 and intermediate node 108 can be driven to the same, or substantially the same voltage. Accordingly, there may be little or no leakage current flowing through second switch 106. The low leakage cutoff mode can be advantageously used to reduce leakage current and thereby enable high fidelity measurements when many test elements 102 are coupled to a section node 112, as the test elements 102 that are configured to provide a high impedance path may contribute little or no leakage current to the section node 112. In one embodiment, the forced voltage node 116 can be driven to substantially the same voltage as the output node 114 using a voltage follower circuit. The test element 102 can be advantageously used to perform high fidelity measurement for transistors, circuits, or test sections that are internal to an integrated circuit, as explained in detail below with reference to measurements performed for integrated circuits having static random access memory (SRAM) circuits.

The arrangement of FIG. 1B is in contrast to a conventional MUX shown in FIG. 2. A conventional MUX 103 can include switches 105, 107 in parallel between a common output node 109 and different input nodes 111, 113, respectively. If a test is conducted through switch 107, even if the other switch 105 is in an off state (i.e., configured to provide a high impedance path), because input node 111 is de-asserted (i.e., at a voltage VSS that is different than a voltage Vtest at output node 109), leakage current (Ileak) can flow through switch 105, contributing to error in a measured current Imeas. This leakage current can have a significant effect on the fidelity of measurements when many switches are connected to the same node, as the leakage current flowing through each switch in the off state contributes to the error in the measured current Imeas.

Referring back to FIGS. 1A and 1B, an output node 114 can be a node internal to an IC device 100. For example, an output node 114 can be a conductive connection between test element 102 and testing circuits formed on a same IC, such as built-in self-test (BIST) circuits. In addition or alternatively, an output node 114 can be an external connection to an IC device 100. For example, an output node 114 can include a physical connection to IC device 100 (e.g., pads, leads, pins, landing, balls, circuit board traces, etc.). In such cases, an external test device (wafer probe, automatic test equipment, etc.) can apply test conditions to test element 102. It is noted that there may be intervening circuits between a test element 102 and an output node 114.

FIG. 3 shows how test elements can be used to lower leakage current in a low leakage cutoff mode of operation, and thereby improve the accuracy of measurements performed on sections of the integrated circuit. FIG. 3 shows an integrated circuit device 300 having two test elements 302-0/1. Such test elements 302-0/1 can have the same structure as test element 102 in FIGS. 1A/B.

FIG. 3 shows test elements 302-0/1 in a test mode of operation. It is assumed that test conditions are being applied to section node 312-1 via test element 302-1, while test element 302-0 serves to isolate its section node 312-0 from any testing. As shown, test element 302-1 is in a standard mode (as in FIG. 1A), enabling a signal path between section node 312-1 and output node 314. In the particular embodiment shown, a test current Itest flows while a voltage Vtest is applied to output node 314.

In contrast, test element 302-0 is in the low leakage cutoff mode. A voltage Vsig, which can be the same as, or substantially the same as Vtest, can be applied to intermediate node 308-0 through test switch 310-0. Consequently, there can be little or no leakage current (Ileak=0) flowing to output node 314 from test element 302-0 to interfere with current Imeas.

FIG. 3 also shows a test circuit 318 coupled to output node 314. A test circuit 318 can apply a test voltage to an output node 314. In the embodiment shown, a test circuit 318 can include a current measuring circuit that can measure Itest. Further, a test circuit 318 can also generate Vsig for application to forced voltage node 316. A test circuit 318 can be a testing device separate from an IC device 300 (e.g., a tester), which can make contact to external connections to an IC. In addition or alternatively, a test circuit 318 can be formed, all or in part, in a same integrated circuit package or substrate (i.e., is part of IC device 300).

While FIGS. 1A/B and 3 have shown test elements with one first switch and one test switch, alternate embodiments can include multiple first switches per one test switch. One such embodiment is shown in FIG. 4.

FIG. 4 shows two test elements 402-0/1 in an arrangement like that of FIG. 3. However, each test element 402-0/1 includes n+1 first switches (404-00 to -0n, 404-10 to -1n). In FIG. 4, test element 402-0 is in a low leakage cutoff mode. In the low leakage cutoff mode, a test switch 410-0 can be conductive (in a low impedance state), applying a test voltage (Vtest) to the intermediate node 408-0. At the same time, all first switches (412-00 to -0n) and the second switch 406-0 can be non-conductive (in a high impedance state).

In FIG. 4, test element 402-1 is in a standard mode. In the standard mode, test switch 410-1 can be non-conductive. At the same time, one of the first switches, e.g., switch 404-11, can be conductive, while the remaining first switches (404-10 and -404-12 to -1n) can be non-conductive. Second switch 406-1 can also be conductive.

Output node 414 can be driven with a voltage that is the same, or substantially the same, as voltage Vtest at intermediate node 408-0.

Test elements according to embodiments shown herein can be formed with any circuit elements suitable for achieving desired reductions in leakage current at an output node. Some embodiments can form test elements with transistors appropriate to the manufacturing process. In particular embodiments, test elements can be formed with insulated gate field effect transistors (e.g., MOS transistors).

FIG. 5 is a schematic diagram of a test element 502 according to one embodiment. Test element 502 can have the configuration shown in FIGS. 1A/B, and in a very particular embodiment, can be one implementation of test element 102 shown in FIGS. 1A/B.

In FIG. 5, first switch 504, second switch 506 and test switch 510 can be formed from complementary MOS (CMOS) passgates, each including complementary conductivity (i.e., n-channel and p-channel) transistors arranged in parallel with one another. Gates of the transistors can be driven with complementary control signals SELECT/SELECTN. Accordingly, when signals SELECT/SELECTN are high/low, respectively, test element 502 can be in a standard mode, first and second switches (504/506) can be conductive, and test switch 510 can be non-conductive. When signals SELECT/SELECTN are low/high, respectively, test element 502 can be in a low leakage cutoff mode, with first and second switches (504/506) being non-conductive, and test switch 510 being conductive. Therefore, in the low leakage cutoff mode, when the voltage at forced voltage node 516 is driven to substantially the same voltage as the output node 514, the test switch 510 can enable driving of the intermediate node 508 with substantially the same voltage as the output node 514.

In one embodiment, signals SELECT/SELECTN can be boosted voltage signals in a test mode. For example, in a non-boosted mode, SELECT can be driven to a high power supply voltage (VDD) and SELECTN can be driven to a low power supply voltage (e.g., VSS). However, in a test mode of operation, signal SELECT can be driven to boosted voltage (e.g., VPP>VDD). In addition or alternatively, signal SELECTN can be driven to a boosted voltage (e.g., VBB<VSS). Such boosted signal levels can enable lower impedance when switches are conductive, and less leakage when switches are non-conductive, as compared to the non-boosted mode of operation.

It is understood that while FIG. 5 shows a test element having switches (504, 506, 510) controlled by a common signal pair, alternate embodiments can control such elements separately.

It is also noted that in an alternate embodiment, any of switches 504, 506, or 510 can be formed by one transistor, rather than as CMOS pass gates, which can receive boosted signals at its gate.

In designing IC devices, is desirable to utilize as little substrate area as possible to increase economies of scale and/or reduce signal routing lengths. Compact area implementations of test elements will now be described.

FIG. 6A is a top plan view of showing a layout of a test element 602-A according to an embodiment. FIG. 6A shows first active regions 620-0/1, in which n-channel transistors can be formed, and second active regions 622-0/1, in which p-channel transistors can be formed. Gate structures 626 for transistors are also shown. Interconnect structures are shown by bold lines. Contact structures (one shown as 628) can provide conductive connections from interconnects to a substrate.

FIG. 6A shows a test element 602-A like that of FIG. 5, having a first switch 604, a second switch 606, and a test switch 610 formed with complementary transistor types. Applied signals (SELECT/SELECTN) are shown next to their corresponding gate structures 626. As shown, a test element 602-A can be implemented with three transistor pitches 624, for a compact design.

Figure 6B:
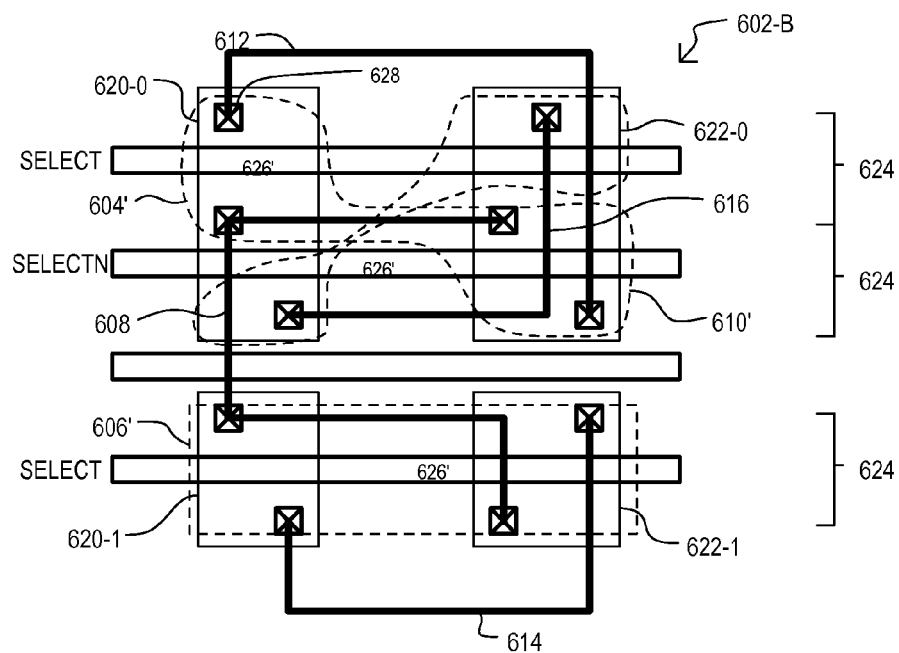

FIG. 6B is a top plan view of showing another layout of a test element 602-B according to an embodiment. FIG. 6B shows items like that of FIG. 6A. However, FIG. 6B differs from FIG. 6A in that gate structures 626' can be common to transistors of different conductivity type, enabling a simpler routing of signals.

Figure 7:
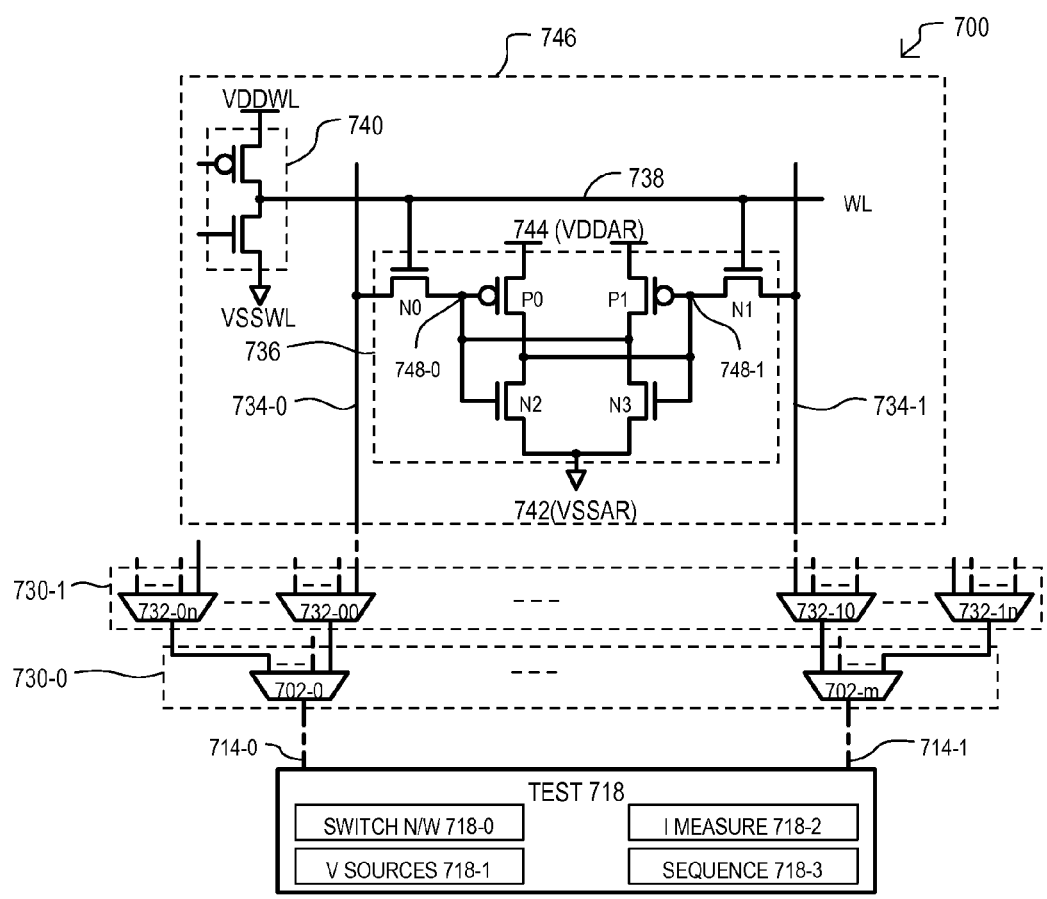
FIG. 7 shows an integrated circuit device with a sense amplifier according to an embodiment.

Referring now to FIG. 7, an integrated circuit device 700 according to another embodiment is shown in block schematic diagram. An IC device 700 can include a first MUX layer 730-0, a second MUX layer 730-1, and a memory section 746. A test circuit 718 is also shown that may, or may not, be part of IC device 700.

A first MUX layer 730-0 can include multiple test elements 702-0 to -m, each of which can take the form of any of the test elements shown herein, or equivalents. Each of test elements 702-0/1 can be coupled to an output node 714-0/1, which is coupled to, or which can be coupled to, test circuit 718.

A second MUX layer 730-1 can include a number of column MUXes 732-00 to 732-1n. Column MUXes can selectively couple bit lines (two shown as 734-0/1) of a memory section 746 to first MUX layer 730-0. In some embodiments, column MUXes (732-00 to -1n) can include test elements as described herein, or equivalents. However, in other embodiments, column MUXes (732-00 to -1n) can include conventional MUX circuits.

It is understood that first and second MUX layers (730-0 and 730-1) can enable signal paths in response to column select data, which can be generated from a memory address, or the like.

In the embodiment shown, a memory section 746 can include bit line pairs (one shown as 734-0/1) coupled to a number of memory cells (one shown as 736). Memory cells 736 can be coupled to a corresponding bit line pair 734-0/1 by operation of a word line 738 driven by a word line driver 740. In the particular embodiment shown, a memory cell 736 can be a six-transistor (6T) static random access memory (SRAM) cell, having two p-channel transistors P0/P1 cross-coupled between storage nodes 748-0/1, two n-channel transistors N2/N3 cross-coupled between storage nodes 748-0/1, and two access transistors N0/N1 that can couple storage nodes 748-0/1 to bit lines 734-0/1. Memory cells (e.g., 736) can be coupled between an high array power supply voltage node 744 and a low array power supply voltage node 742.

A word line driver 740 can drive a word line 738 between a high voltage VDDWL and a low voltage VSSWL. A voltage VDDWL can be substantially higher than a high array supply voltage VDDAR, and VSSWL can be substantially lower than VSSAR. A boosted low voltage VSSWL can force access transistors N0/N1 to very low leakage states. A boosted high voltage VDDWL can eliminate any voltage threshold drop across access transistors N0/N1, and place such transistors into very low impedance states to improve current/voltage readings in test operations.

A test circuit 718 can include a switch network 718-0, voltage sources 718-1, a current measuring circuit 718-2, and a sequencer 718-3. A switch network 718-0 can couple test output nodes 714-0/1 to various sections within test circuit 718. Voltage sources 718-1 can provide various test voltages for application to output nodes 714-0/1. Such test voltages can be constant voltages, variable voltages (e.g., a sweep over a range), or differential voltages for application between a pair of output nodes 714-0/1. A current measuring circuit 718-2 can measure a current flowing through an output node 714-0/1. A sequencer 718-3 can execute a test sequence by applying test voltages, and optionally control signals to the device 700. The sequencer 718-3 can also execute test sequences that include generating addresses for the memory section 746 that enable accesses to a selected cell in the memory section 746, and thereby enable the execution of test sequences and the application of test voltages to the selected cell.

In a standard mode of operation, all test elements 702-0 to -m can be placed in a standard mode of operation, enabling read and/or write paths to memory cells 736 via bit lines.

In a test mode of operation, two of test elements 702-0 to -m can be placed in a standard mode of operation, while remaining test elements can be placed in the low leakage cutoff mode. The two test elements in the standard mode can enable test circuit 718 to apply test conditions to memory section 746. Test conditions according to particular embodiments will be described in more detail below.

Figure 8:
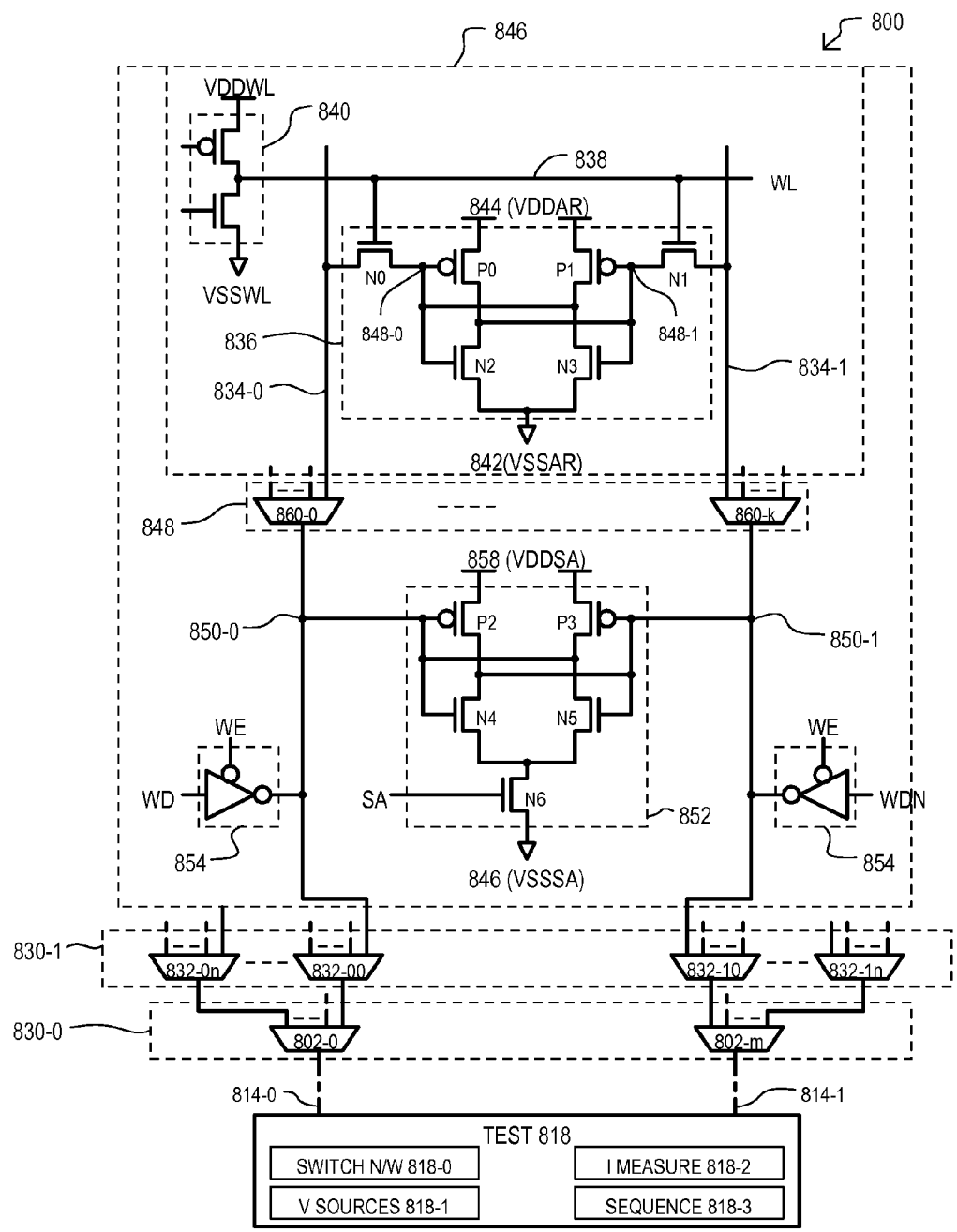
FIG. 8 shows an integrated circuit device with a sense amplifier isolated from bit lines with column select circuits according to an embodiment.

Referring now to FIG. 8, an integrated circuit device 800 according to another embodiment is shown in block schematic diagram. An IC device 800 can include sections like FIG. 7. FIG. 8 differs from FIG. 7 in that a column select layer 848 and a sense amplifier 852 can be included between bit lines 834-0/1 and second MUX layer 830-1.

A column select layer 848 can include column select circuits 860-0 to -k that couple bit lines (e.g., 834-0/1) to MUX layers (830-0/1) based on column select values.

While embodiments can include various types of sense amplifiers, in the particular embodiment of FIG. 8, sense amplifier 852 can include two p-channel sense transistors P2/P3 cross coupled between sense node 850-0/1, two n-channel sense transistors N4/N5 cross-coupled between sense nodes 848-0/1, and an enable transistor N6. Sense amplifier 852 can be coupled between a high sense amplifier supply voltage VDDSA and a low sense amplifier supply voltage VSSSA.

FIG. 8 also shows a write driver 854 which can drive sense nodes 850-0/1 with complementary write data WD/WDN during a write operation to a memory cell 836. Alternative embodiments can have other write driver configurations to drive the sense nodes during a write operation to the memory cell, e.g., the write drivers can be placed at the inputs of the column select circuits 860-0 to -k.

In an arrangement like that of FIG. 8, a sense amplifier 852 can also be tested through test elements 802-00 to -1n. When testing a sense amplifier 852, a column select layer 848 can be driven to a high impedance state to isolate a sense amplifier 852 from bit lines 834-0/1. Sense amplifier test conditions according to particular embodiments will be described in more detail below.

Figure 9:
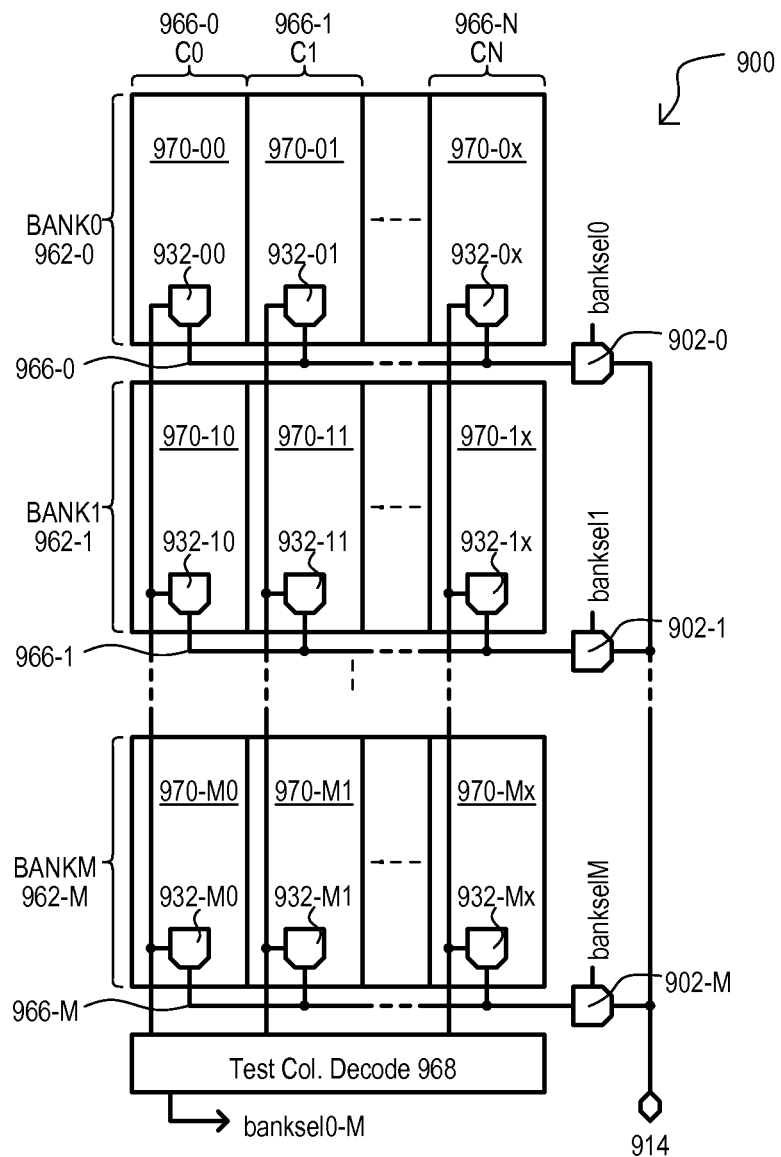
FIG. 9 is a plan view of an integrated circuit device having memory arrays arranged into blocks according to an embodiment.

Embodiments of the invention can include memory sections having memory cells organized into banks. One such embodiment is shown in FIG. 9. Referring to FIG. 9, an integrated circuit device 900 can include a number of banks 962-0 to -M. Each bank (962-0 to -M) can include columns 966-0 to -N. Each column (966-0 to -N) within a bank can be coupled to a bank I/O node 966-0 to -M by column MUXes 932-00 to -Mx. Bank I/O nodes (966-0 to -M) can be coupled to output node 914 by bank selectors 902-0 to -M. Any of column MUXes (932-00 to -Mx) and/or bank selectors (902-0 to -M) can include test elements as described herein, or equivalents A test column decoder 968 can enable and disable test elements within column MUXes (932-00 to -Mx) and/or bank selectors (902-0 to -M) to enable test modes of operation.

Accordingly, circuit elements within any of the banks can be tested as described herein, or equivalents.

Figure 10:
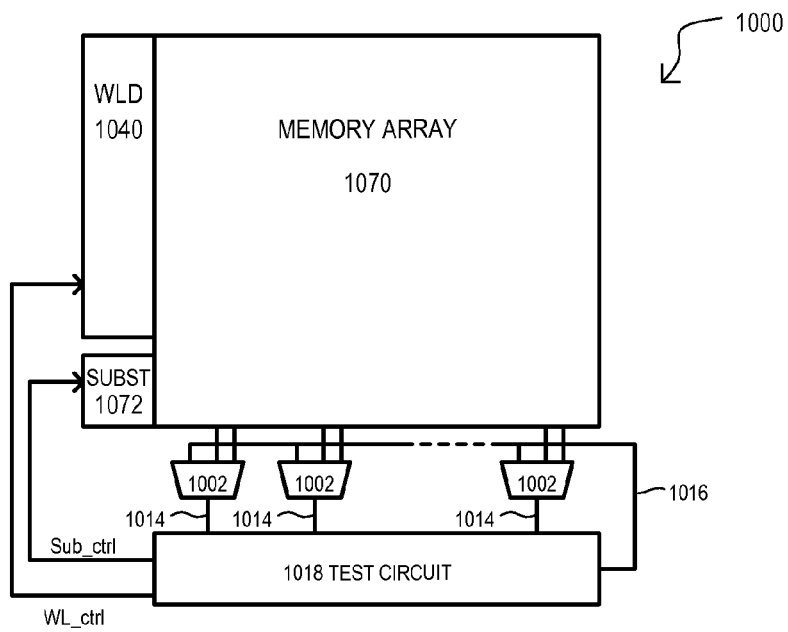
FIG. 10 is a block schematic diagram of a memory device according to an embodiment.

FIG. 10 shows an integrated circuit device 1000 according to another embodiment. FIG. 10 shows a memory device having a memory array 1070, word line drivers 1040, and a substrate control circuit 1072. Test elements 1002 can be included to selectively provide low leakage current test paths between nodes in memory array as described herein and equivalents. A memory array 1070 can include a number of memory cells arranged into rows and columns, accessible through test elements 1002 (and, optionally, additional circuits such as column MUXes). In one embodiment, a memory array 1070 can include SRAM cells, in particular 6T SRAM cells. Word line drivers 1040 can drive word lines to select particular memory cells (e.g., couple memory cells to bit lines in memory array 1070). A substrate control circuit 1072 can vary a substrate bias applied to memory cells of memory array 1070 during certain tests.

A test circuit 1018 can apply test conditions to a memory array 1070 and derive test results from memory array 1070 through test elements 1002. In the embodiment shown, a test circuit 1018 can also control word line driver 1040 and substrate control circuit 1072. As noted above, a test circuit 1018 may, or may not, be part of IC device 1000.

Having described IC devices with test elements that can enable accurate testing of circuit devices, particular test operations according to embodiments will now be described.

FIGS. 11A to 11D show testing of a 6T SRAM cell like that shown in FIGS. 7 and 8. FIGS. 11A to 11D show a memory cell 1136 and test elements 1102-0 to -3.

Figure 11A:
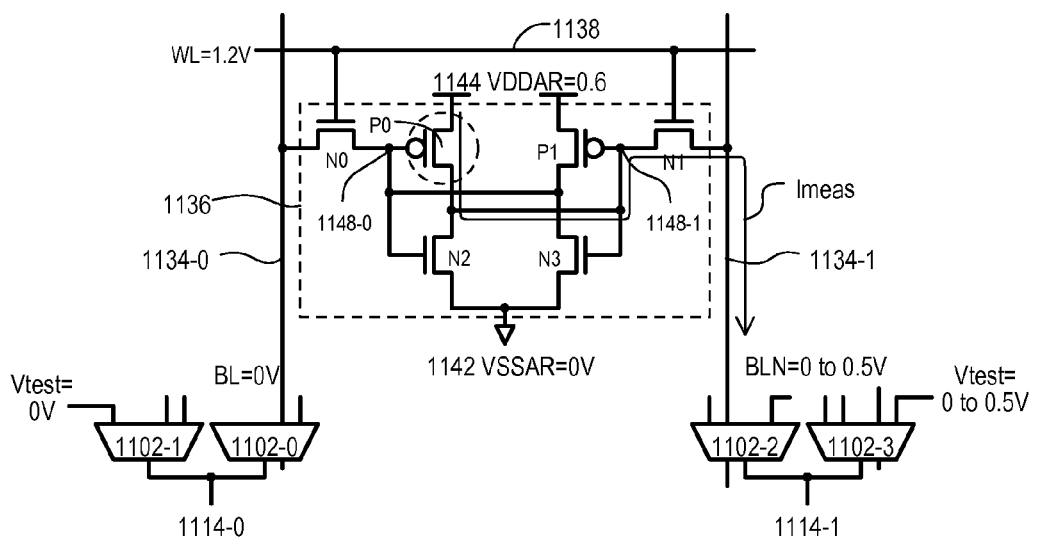
FIGS. 11A to 11D are block schematic diagrams showing the testing of transistors within memory cells according to embodiments.

FIG. 11A shows a test operation with a p-channel load transistor P0 being the transistor under test (TUT). In the testing operation, transistor N2 can be forced off, and bias voltages can be applied to TUT P0 that result in a current flowing through P0 and access transistor N1 to bit line 1134-1.

In the test operation, a word line 1138 can be driven to a level that enables pass transistors N0/N1. Such a word line voltage can be substantially higher than an array high supply voltage VDDAR. In the particular embodiment shown, a word line 1138 can be driven to 1.2V while VDDAR=0.6V.

A first test voltage can be applied to a gate of TUT P0 through test element 1102-0 and access transistor N0. Thus, test element 1102-0 can be in a standard state, allowing a signal path to output node 1114-0. In contrast, any test elements (i.e., 1102-1) coupled to the same output node 1114-0 can be in a low leakage cutoff mode, thus an intermediate node within such test elements can be driven to a voltage that can match that at output node 1114-0. In the particular embodiment shown, bit line 1134-0 can be driven to 0V, thus non-selected test element 1102-1 can apply 0V to its intermediate node.

A second "sweeping" test voltage can be applied to a drain of TUT P0 through test element 1102-2 and access device N1. Thus, test element 1102-2 can be in a standard mode while test element (i.e., 1102-3) coupled to the same output node 1114-1 can be in a low leakage cutoff mode. A sweeping voltage can vary over time, enabling multiple current (Imeas) values to be acquired. Non-selected test element 1102-3 can apply substantially the same sweeping voltage to its internal node. In the particular embodiment shown, bit line 1134-1 can be swept between 0V and 0.5V, and a resulting current (Imeas) can be measured at various points, thus providing an accurate characterization of TUT P0.

It is understood that the other p-channel load transistor P1 can be tested in the same fashion as P0 by swapping the test voltages applied to the bit lines.

Figure 11B:
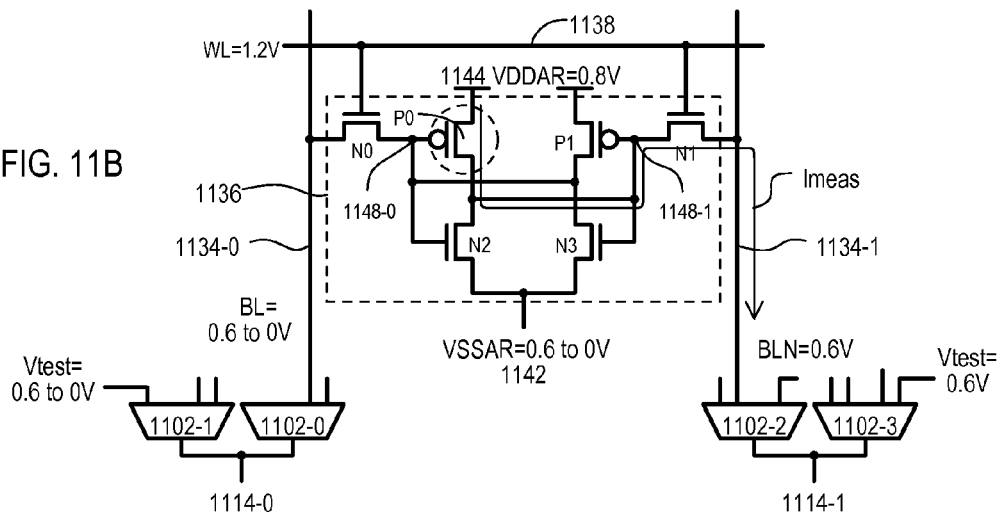

FIG. 11B shows an alternate test operation for P0 as the TUT. In the testing operation, transistor N2 and N3 can be forced off, and bias voltages can be applied to TUT P0 that result in a current flowing through P0 and N1 to bit line 1134-1.

In the test operation, a word line 1138 can be driven as in FIG. 11A. However, in the embodiment shown an array high supply voltage VDDAR can be 0.8V.

A first sweeping voltage can be applied to a gate of TUT P0 through test element 1102-0 and access transistor N0. In addition, a low array power supply voltage VSSAR can be swept in the same fashion. Selected test element 1102-0 can be in a standard state, while non-selected test elements (e.g., 1102-1) coupled to a same output node 1114-0 can be in a low leakage cutoff mode, and receive the same, or substantially same sweeping voltage. In the embodiment shown, a sweeping voltage can be between 0.6 and 0 V.

A second test voltage can be applied to a drain of TUT P0 through test element 1102-2 and access device N1. Selected test element 1102-2 can be in a standard mode and non-selected test elements (i.e., 1102-3) can be in a low leakage cutoff mode and receive substantially the same voltage. In the particular embodiment shown, bit line 1134-1 can receive 0.6V.

Current (Imeas) through bit line 1134-1 can be measured to provide accurate characterization of TUT P0.

It is understood that the other p-channel load transistor P1 can be tested in the same fashion as P0 by swapping the test voltages applied to the bit lines.

Figure 11C:
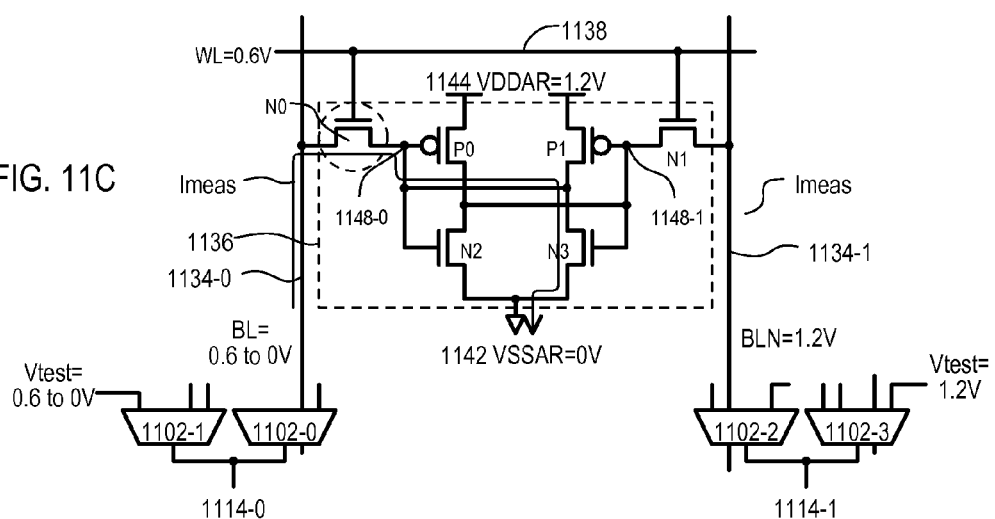

FIG. 11C shows another test operation with access transistor N0 as the TUT. In the testing operation, transistor N2 and P1 can be forced off, and bias voltages can be applied to TUT N0 that result in a current flowing through N0 and N3 from bit line 1134-0.

In the test operation, a word line 1138 can be driven to a test level which gives a desired current response based on the drain-source voltage (VDS) applied to TUT N0. In the particular embodiment shown, a word line 1138 can be driven to 0.6V. An array high supply voltage VDDAR can be 1.2V.

A first sweeping voltage can be applied to a drain of transistor N0 by way of bit line 1134-0. A selected test element 1102-0 can be in a standard state, while non-selected test elements (e.g., 1102-1) can be coupled to receive the same, or substantially the same, sweeping voltage. In the embodiment shown, a sweeping voltage can be between 0.6 and 0 V.

A second test voltage can be applied to a gate of transistor N3 to ensure N3 provides a current path to VSSAR for TUT N0. Selected test element 1102-2 can be in a standard mode and non-selected test elements (i.e., 1102-3) can be in a low leakage cutoff mode. In the particular embodiment shown, bit line 1134-1 and non-selected test element 1102-3 can receive 1.2V.

Current (Imeas) through bit line 1134-0 can be measured to provide accurate characterization of TUT N0.

It is understood that the other access transistor N1 can be tested in the same fashion as N0 by swapping the test voltages applied to the bit lines.

Figure 11D:
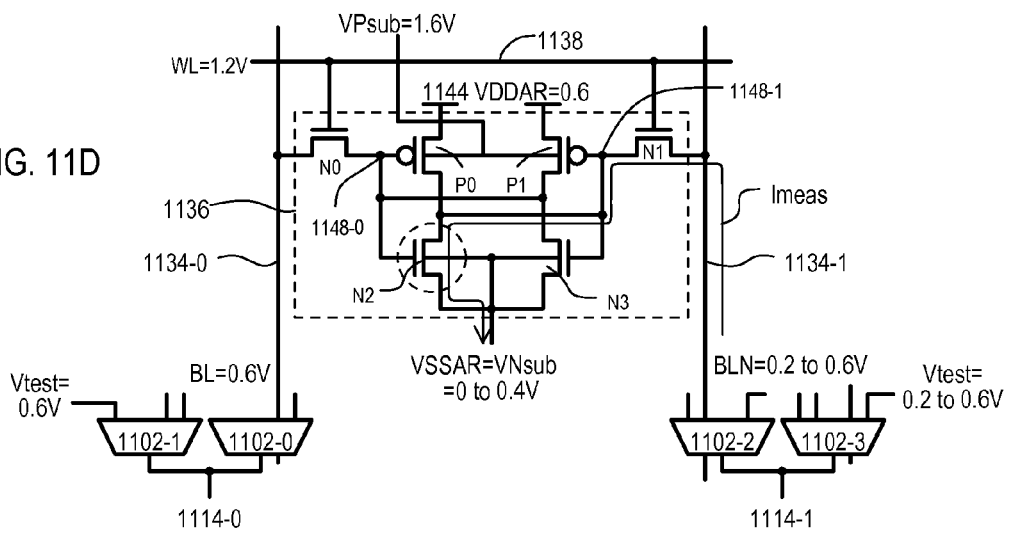

FIG. 11D shows another test operation with n-channel pull-down transistor N2 as the TUT. In the testing operation, transistor P0 can be forced off, and bias voltages can be applied to TUT N2 that result in a current flowing through N2 and N1 from bit line 1134-1.

In the test operation, a word line 1138 can be driven to a test level that enables access transistors N0/N1. In the particular embodiment shown, a word line 1138 can be driven to 1.2V. An array high supply voltage VDDAR can be 0.6V. A substrate voltage for transistors P0/1 (VPsub) can be driven to 1.6V.

A first test voltage can be applied to a gate of transistor N2 through access transistor N0. Selected test element 1102-0 can be in a standard mode, while non-selected test elements (e.g., 1102-1) can be in the low leakage cutoff mode.

A second sweeping test voltage can be applied to a drain of transistor N2 through access transistor N1 to generate a current Imeas that varies according to the VDS of TUT N2. In the particular embodiment shown, such sweeping voltage can be between 0.2 and 0.6 V.

It is noted that body biases (VNsub) can be applied to the TUT (e.g., N2/N3) to raise threshold voltages of such devices. This can reduce unwanted currents in the memory cell 1136. In the particular embodiment shown, such biases can be between 0 and 0.4 V.

It is understood that the other n-channel pull-down transistor N3 can be tested in the same fashion as N2 by swapping the test voltages applied to the bit lines.

It is noted that in the testing operations shown in FIGS. 11A to 11D, it may be desirable to first place the memory cell 1136 into a desired state (e.g., set storage nodes 1148-0/1 to desired complementary states) with a write operation prior to the test operation.

Test operations such as those described herein can result in high fidelity characterization of transistors within a tested portion of an IC device. In some embodiments, current accuracy can be within 1% using appropriate biasing conditions.

Figure 12:
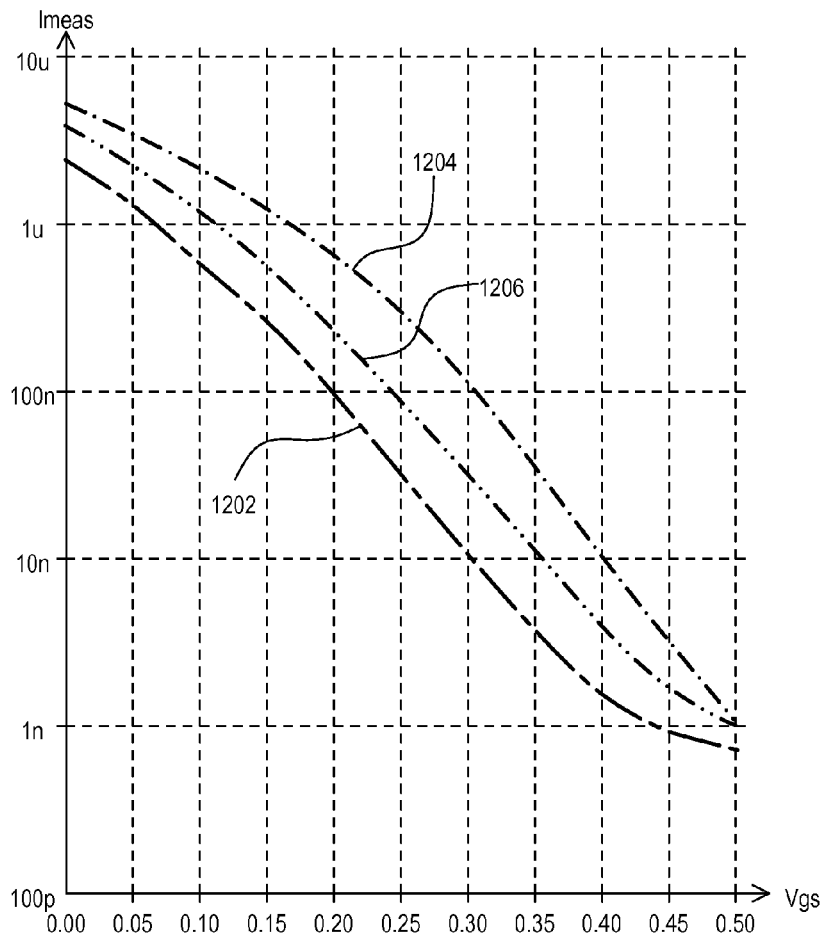
FIG. 12 is a graph showing measurement results for memory cell transistors according to an embodiment.

FIG. 12 shows particular measurements for an operation like that shown in FIG. 11C or 11D.

FIG. 12 is a graph showing a measured current (Imeas) versus a gate-to-source voltage (Vgs). A measured current (Imeas) can be a current measured from a test output coupled to multiple test elements, like those shown in FIG. 5. Curve 1206 shows responses for transistors having a nominal threshold voltage (Vt=Vtnom). Curve 1202 shows a response for a transistor having a threshold voltage that is 50 mV higher than a nominal value (Vt=Vtnom+50 mV). Curve 1204 shows a response for a transistor having a threshold voltage that is 50 mV lower than a nominal value (Vt=Vtnom−50 mV). As shown, such small variations in threshold voltage are clearly distinguishable by the test results.

It is noted that a threshold voltage (Vt) can be value established according to well understood techniques. For example, a threshold voltage can be a Vgs at which a drain-to-source current (IDS) has a predetermined value for a given drain-to-source voltage (VDS).

As noted above, while embodiments having memory sections can test transistors within memory cells, for some architectures (e.g., FIG. 8) it can be possible to test transistors within sense amplifiers of the memory section. One such embodiment is shown in FIG. 13.

Figure 13:
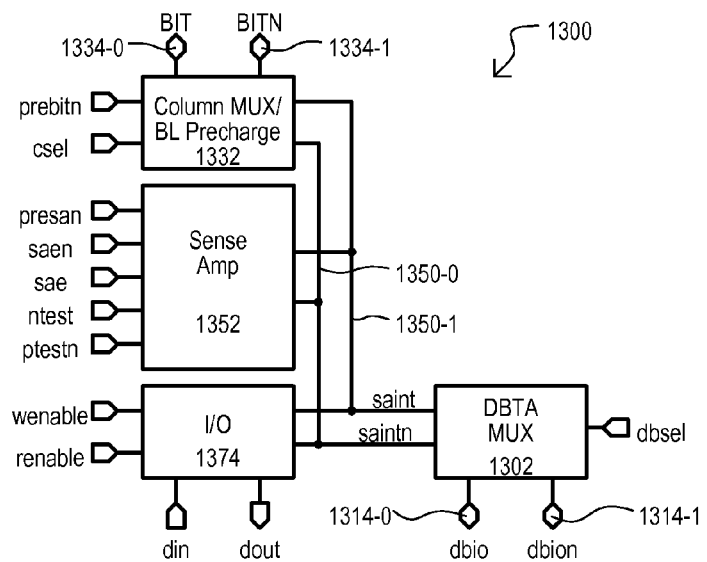
FIG. 13 is a block schematic diagram of an integrated circuit device according to an embodiment.

Referring now to FIG. 13, an IC device 1300 according to another embodiment is shown in a block schematic diagram. The IC device 1300 can include a column MUX/precharge section 1332, a sense amplifier 1352, and I/O section 1374, and test section 1302.

A column MUX/precharge section 1332 can be coupled between bit lines (BIT/BITN) and sense nodes 1350-0/1. In response to a precharge signal (prebitn), column MUX/precharge section 1332 can precharge bit lines (BL/BLN) to a precharge potential. In response to column select data (csel), column MUX/precharge section 1332 can couple a bit line pair (BL/BLN) to sense nodes 1350-0/1.

A sense amplifier (SA) 1352 can sense a data value on a selected bit line pair (BL/BLN). In a sense operation, prior to sensing a data value, sense nodes 1350-0/1 can be precharged to a SA precharge voltage by activation of SA precharge signal (presan). When sensing a data value, bit line precharge circuits in 1332 can be disabled. A memory cell can be coupled to a bit line pair (BL/BLN), and the bit line pair coupled to sense nodes 1350-0/1 by operation of column MUX/precharge section 1332. According to a data value stored in the memory cell, a differential voltage can develop across a bit line pair (BL/BLN), and hence across sense nodes 1350-0/1. When sense amplifier enable signals (sae/saen) are activated, the sense nodes 1350-0/1 can be driven to opposing voltages based on the differential voltage.

Unlike a conventional sense amplifier, SA 1352 of FIG. 13 can also receive test signals (ntest/ptestn), which can disable portions of SA 1352 to enable transistors in other portions to be tested. Particular examples of such operations will be described in more detail below.

An I/O section 1374 can output data (dout) based on potentials across sense nodes 1350-0/1, or can drive data on sense nodes 1350-0/1 in response to input data (din). In particular, in response to an active read enable signal (renable), a data output (dout) will be driven based on a potential between sense nodes 1350-0/1. In response to an active write enable signal (wenable), sense nodes 1350-0/1 will be driven to different voltages according to an input data value (din).

A test section 1302 can include test elements as described herein, or equivalents. Such test elements can be enabled in response to a test enable signal (dbsel). When enabled, test voltages can be driven on outputs 1314-0/1 and/or current flowing through outputs 1314-0/1 can be measured. Further, signal paths for such test values can be very low leakage signals paths as described above.

Figure 14:
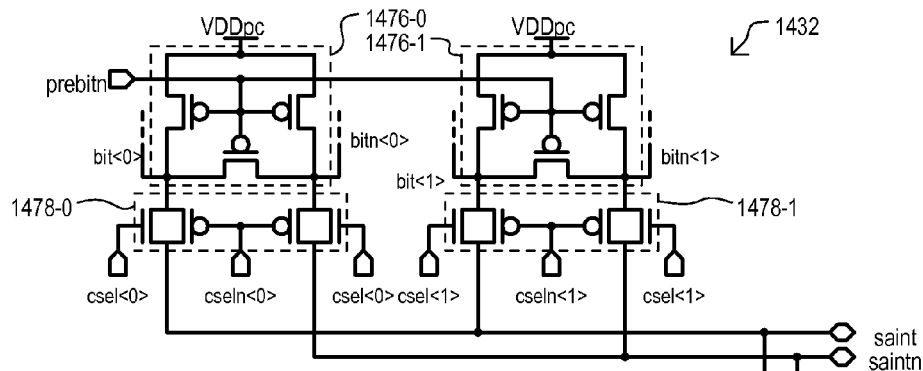
FIG. 14 is a schematic diagram of a column select MUX/precharge circuit that can be included in embodiments.

Referring to FIG. 14, a column MUX/precharge section 1432 that can be included in embodiments is shown in a block schematic diagram. In one embodiment, the column MUX/precharge section 1332 (FIG. 13) can be implemented using the column MUX/precharge section 1432.

A column MUX/precharge section 1432 can include bit line precharge circuits 1476-0 to -3 and column select circuits 1478-0 to -3, each of which can be coupled to a corresponding bit line pair bit<n>, bitn<n>(where n=0 to 3). In response to an active precharge signal prebitn, precharge circuits (1476-0 to -3) can precharge their respective bit lines bit<n>/bitn<n> to a precharge voltage VDDpc. In response to particular column select signals csel<n>, cseln<n> (where n=0 to 3), a column select circuit (1476-0 to -3) can couple its bit line pair to sense nodes 1450-0/1.

Figure 15A:
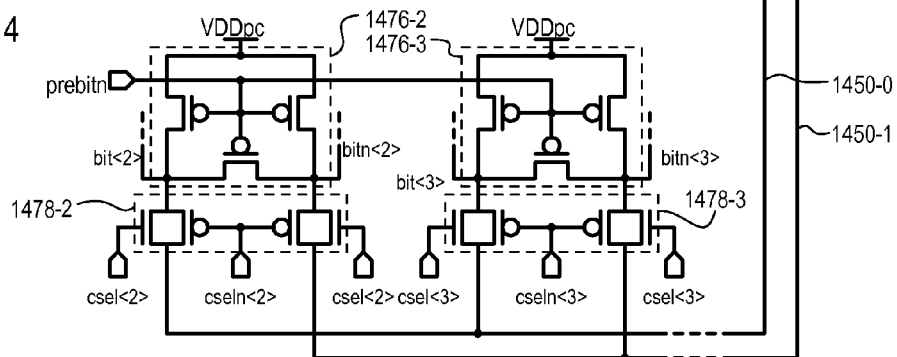
FIGS. 15A to 15C are schematic diagrams showing the testing of a sense amplifier circuit according to an embodiment.
Figure 15A:
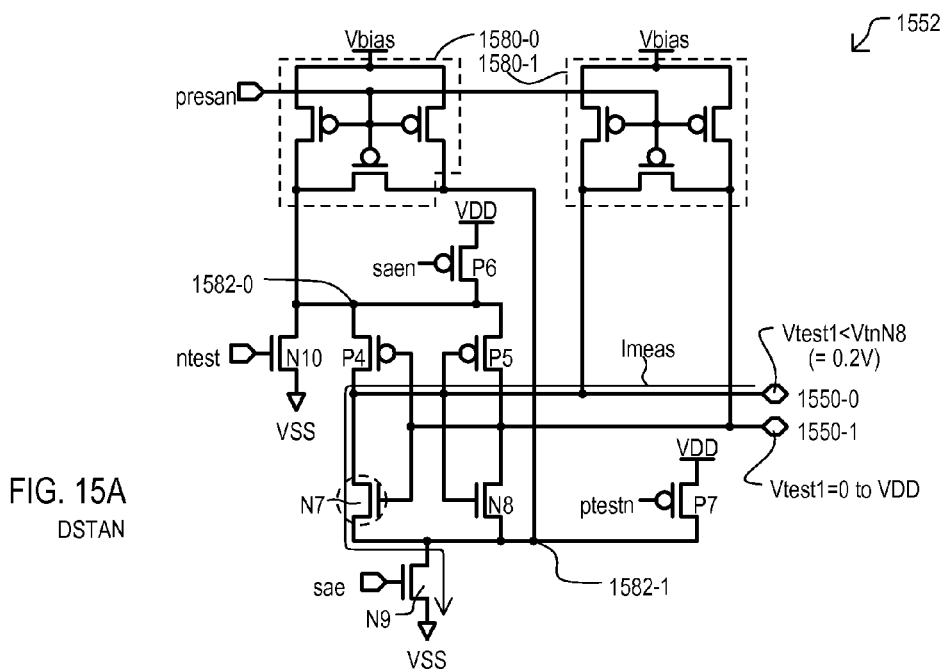
Figure 15B:
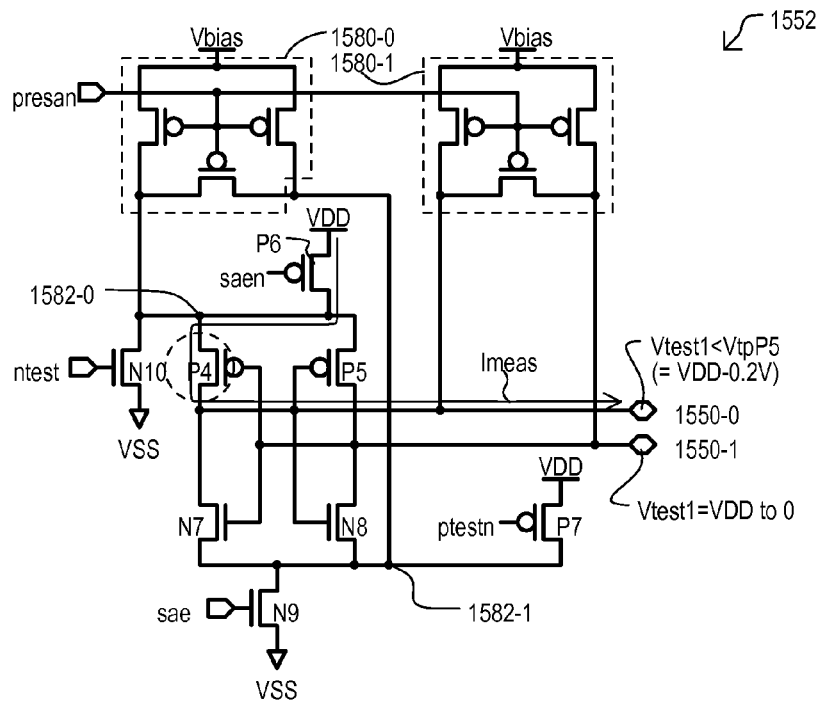
Figure 15C:
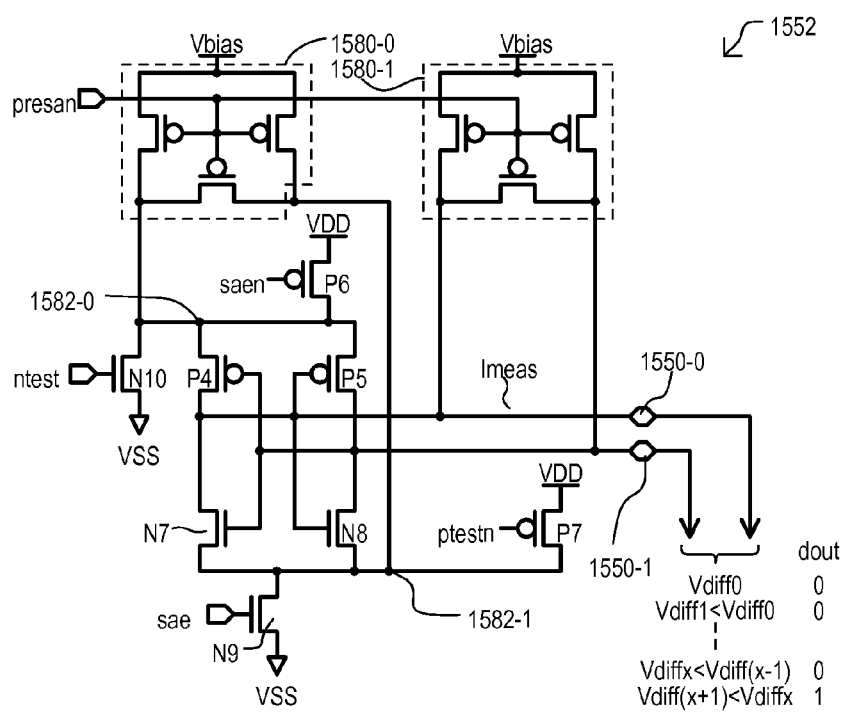

Referring to FIG. 15A to 15C, a sense amplifier (SA) 1552 according to an embodiment is shown in schematic diagrams. In one embodiment, SA 1552 can be that shown as 1332 in FIG. 13.

SA 1552 can include SA precharge circuits 1580-0/1, p-channel sense transistors P4/P5 and n-channel sense transistors N7/N8 cross-coupled between sense nodes 1550-0/1, a first enable transistor P6 coupled between a first enable node 1582-0 and a high power supply node VDD, a second enable transistor N9 coupled between a second enable node 1582-0 and a low power supply voltage VSS, a first test transistor N10 coupled between first enable node 1582-0 and a low power supply voltage VSS, and a second test transistor P7 coupled between second enable node 1582-1 and a high power supply voltage VDD.

SA precharge circuits 1580-0/1 can be commonly controlled according to signal presan. When signal presan is active (low), SA precharge circuits 1580-0/1 can precharge sense nodes 1550-0/1 and enable nodes 1582-0/1 to a SA precharge voltage (Vbias). Enable transistor P6 can be controlled according to signal saen to connect or isolate first enable node 1582-0 from supply voltage VDD. Similarly, enable transistor N9 can be controlled according to signal sae to connect or isolate second enable node 1582-1 from supply voltage VSS. Test transistor N10 can be controlled according to signal ntest to disable sense transistors P4/P5 and enable the testing of sense transistor N7 or N8 by coupling first enable node 1582-0 to VSS. Test transistor P7 can be controlled according to signal ptestn to disable sense transistors N7/N8 and enable the testing of sense transistor P4 or P5 by coupling second enable node 1582-1 to VDD.

Having described various sections of an IC device (i.e., FIGS. 13 to 15C) that can enable a testing of sense amplifier transistors, various modes of operation for such a device will now be described with reference to FIG. 16 in conjunction with FIGS. 13 to 15C.

Figures 16, 17:
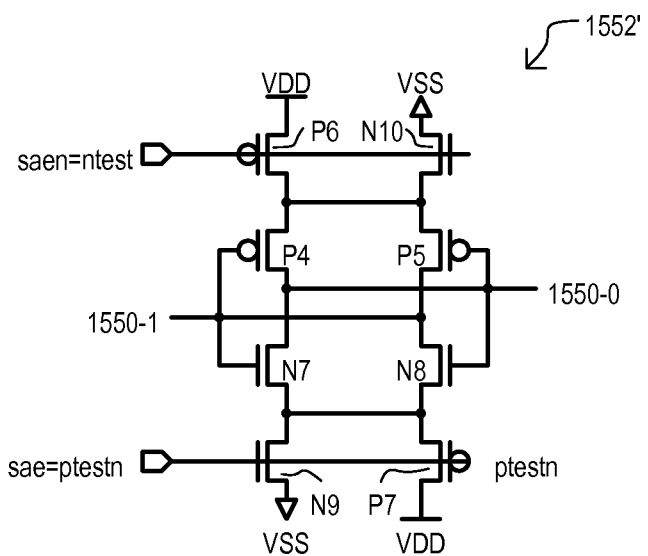
FIG. 16 is a table showing control signals for various modes of operation for a device like that of FIG. 13, according to an embodiment.
FIG. 17 is a diagram showing a sense amplifier layout according to an embodiment.

FIG. 16 is a table showing six different modes of operation for an IC device like that shown in FIGS. 13 to 15C. FIG. 16 shows logic values for the various control signals of an IC device for each corresponding mode. The modes include: "Read" in which data can be read from the IC device; "Write" in which data can be written into the IC device; "DBTA" in which transistors within a memory array can be tested via bit lines; "DSTAN" in which n-channel transistors in a sense amplifier can be tested; "DSTAP" in which p-channel transistors in a sense amplifier can be tested; and "Offset" in which an offset voltage of a sense amplifier can be tested.

Referring now to FIG. 16 in conjunction with FIGS. 13, 14 and 15A, in a Read mode, dbsel=0 disabling test elements within test section 1302, wenable=0 disabling write operations, and ntest=0/ptestn=1 disabling test devices within SA 1352/1552. When a selected memory cell is accessed, other control signals can pulse. Such transitions are shown by values separated with a slash, and represent first transitions in an active read cycle operation. Sense amplifiers are normally off when unselected, but for the selected locations sae and saen transition to the "on" state (0/1 for sae and 1/0 for saen).

Precharge signals presan and prebitn are normally "on" in the unselected locations (keeping the unselected bit lines and unselected sense amps precharged), but transition to "off" 0/1 when selected for the read operation. Turning off precharge circuits (e.g., 1476-0/1, 1580-0/1) can enable a small signal to develop between bit lines (BL/BLN) without contention with the precharge circuits. Column select csel is normally off, but transitions to "on" 0/1 at the beginning of a read cycle (cseln is understood to be the complement of csel). The SA 1352 can be activated by sae (0/1) and saen (1/0) to amplify the small signal, thereby driving sense nodes 1350-0/1 to opposing voltages. Afterward, read enable signal can be activated (renable 0/1), and I/O section 1374 can drive read data on dout.

Referring again to FIG. 16 in conjunction with FIGS. 13, 14 and 15A, in a Write mode, dbsel=0, and ntest=0/ptestn=1 as in the Read mode. Further, renable=0, disabling read amplifiers in I/O section 1374. When a selected memory cell is written, signals can pulse as shown in FIG. 16. In particular, precharge signals presan and prebitn are normally "on" in the unselected locations (keeping the bit lines and SAs precharged), but transition to "off" 0/1 for the selected write location to allow the bit lines to be written to full complementary levels without contention with the precharge circuits. SA 1352 can be disabled with sae=0, saen=1. Column Select csel is normally off, but in a write mode can transition to "on" 0/1 at the beginning of the write cycle. A write enable signal can be activated (wenable 0/1), and data at din can be driven on sense nodes 1350-0/1 and bit lines of the written memory cell through a column MUX/precharge section 1332.

Referring again to FIG. 16 in conjunction with FIGS. 13, 14 and 15A, in a DBTA mode, an IC device 1300 can operate in a DC mode, where timing clocks can be stopped and control signals can have either an "on" or "off" state. In a DBTA mode, individual transistors within a memory array can be tested. Such testing, according to very particular embodiments, is shown in FIGS. 11A to 11D. Column select signal csel can have an enable state (csel=1), coupling bit lines (BL/BLN) to sense nodes 1350-0/1. SA 1352 can be disabled (sae=0 and saen=1). In addition, in order to more fully remove SA 1352 from a test path, test signals can be driven to active levels (ntest=1 and ptestn=0), thereby disabling cross-coupled transistors within SA 1352. Precharge circuits for both bit lines 1476-0/1 and the SA nodes 1550-01/can also disabled, to not interfere with the testing. Signal dbsel can be active (dbsel=1), enabling test elements within test section 1302 to provide high fidelity (i.e., low leakage current) test signal paths to transistors within a memory cell being tested. Signals renable and wenable can both be disabled.

Referring once again to FIG. 16 in conjunction with FIGS. 13, 14 and 15A, in a DSTAN mode, an IC device 1300 can also operate in a DC mode. In a DSTAN mode, n-channel devices within SA 1352 can be tested. Signal csel is inactive (csel=0), isolating bit lines BL/BLN from an SA 1352, and bit line precharge circuits 1476-0/1 can be disabled (prebitn=1).

If more than one bit line BL/BLN is coupled to the SA 1352 by parallel multiplexers, such as the column select circuits 1478-0 to 3 (FIG. 14), then all of the column select circuits can be deselected in this mode. Write amplifiers and read amplifiers in I/O section 1374 can be disabled (renable=0, wenable=0). Test elements within test section 1302 can be enabled (dbsel=1) to provide high fidelity test paths to SA 1352.

FIG. 15A shows a SA 1552 in a DSTAN mode. Enable device P6 can be disabled (saen=1), while first test device N10 can be enabled (ntest=1), driving the sources of cross-coupled p-channel sense transistors P4/P5 to VSS, disabling such transistors. Enable device N9 can be enabled (sae=1), and test device P7 can be disabled (ptestn=1). SA precharge circuits 1580-0/1 can be disabled (presan=1). The particular embodiment of FIG. 15A shows a testing of transistor N7. In such a test, sense node 1550-0 can be driven (via a test element) to a voltage less than a threshold voltage of the other n-channel transistor (i.e., Vtn of N8). In one very particular embodiment, such a level can be about 200 mV. The other sense node 1550-1 can be swept from 0 to VDD (or at least to a level significantly higher than the Vtn of N8) via another test element. A current (Imeas) flowing at sense node 1550-0 can be monitored to give current-to-voltage (I/V) characteristics (and thus the Vtn) of N7 in a linear mode of operation. To test n-channel transistor N8, voltages applied to sense nodes 1550-0/1 can be reversed.

Referring now to FIG. 16 in conjunction with FIGS. 13, 14 and 15B, in a DSTAP mode, an IC device 1300 can also operate in a DC mode. Signals csel, prebitn, renable, wenable, and dbsel can have the same values as the DSTAN mode.

FIG. 15B shows a SA 1552 in a DSTAP mode. Enable device N9 can be disabled (sae=0), while second test device P7 can be enabled (ptestn=0), driving the sources of cross-coupled n-channel sense transistors N7/N8 to VDD, disabling such transistors. Enable device P6 can be enabled (saen=0), and test device N10 can be disabled (ntestn=0). SA precharge circuits 1580-0/1 can be disabled (presan=1). The particular embodiment of FIG. 15B shows a testing of transistor P4. In such a test, sense node 1550-0 can be driven (via a test element) to a voltage less than a threshold voltage of the other p-channel transistor (i.e., Vtp of P5). In one very particular embodiment, such a level can be about VDD-200 mV. The other sense node 1550-1 can be swept from VDD to 0 (or at least to a level significantly lower than Vtp of P5) via another test element. A current (Imeas) flowing at sense node 1550-0 can be monitored to give current-to-voltage (I/V) characteristics (and thus the Vtp) of P4 in a linear mode of operation. To test p-channel transistor P5, voltages applied to sense nodes 1550-0/1 can be reversed.

Referring now to FIG. 16 in conjunction with FIGS. 13, 14 and 15C, in an Offset mode, an IC device 1300 can operate in an AC mode of operation, with system clocks running. However, unlike a Read or Write mode, SA 1352 can be controlled through test section 1302. In an Offset mode, an offset of cross-coupled n- and p-channel transistors (i.e., P4/P5, N7/N8) inside SA 1352 can be tested.

Signal csel can be disabled (csel=0), isolating bit lines BL/BLN from sense nodes 1350-0/1. In the embodiment shown, prebitn=1, disabling bit line precharge circuits 1476-0/1. Signal dbsel can be active (dbsel=1) enabling test elements within test section 1302. In addition, wenable=0, disabling write amplifiers within I/O section 1374. However, renable=1, enabling I/O section 1374 to drive dout based on voltages between sense nodes 1350-0/1.

FIG. 15C shows SA 1552 in an Offset mode that can be used to measure the as-fabricated sense amplifier offset. Test transistors P7, N10 can be disabled (ntest=0, ptestn=1). SA precharge circuits 1580-0/1 can also be disabled (presan=1). Enable transistors P6 and N9 can be activated by pulsing saen (1/0) and sae (0/1), as in a read operation. In an Offset mode, test elements within test section 1302 can apply a sequence of differential voltages to sense nodes 1350-0/1. An Offset test can begin with a reasonably large differential across sense nodes 1350-0/1 (i.e., a differential know to be greater than any offset voltage of the SA 1352). An SA 1352 can be activated to generate an output value (e.g., dout=0) in response to the differential voltage. Such actions can be repeated, gradually reducing (and if necessary reversing the polarity of) the differential voltage until a change in the output value occurs (dout=1). According to one embodiment, the differential voltage at which the output value switches can be determined to be the offset voltage of the SA 1352. In an alternative embodiment, the offset voltage of the SA 1352 is determined by performing a binary search of the differential voltages to sense nodes 1350-0/1.

FIG. 17 shows an alternate configuration for a sense amplifier 1552' like that shown in FIGS. 15A to 15C. In FIG. 17, signals saen and ntest can be the same. Similarly, sae and ptestn can be the same. In such an arrangement, signal routing can be advantageously compact.

While FIGS. 15A to 15C shows test modes of operation for one particular sense amplifier circuit, it is understood that other embodiments can include any other suitable sense amplifier circuits. Two of many possible alternate embodiments for testing different sense amplifier circuits will now be described.

Figure 18:
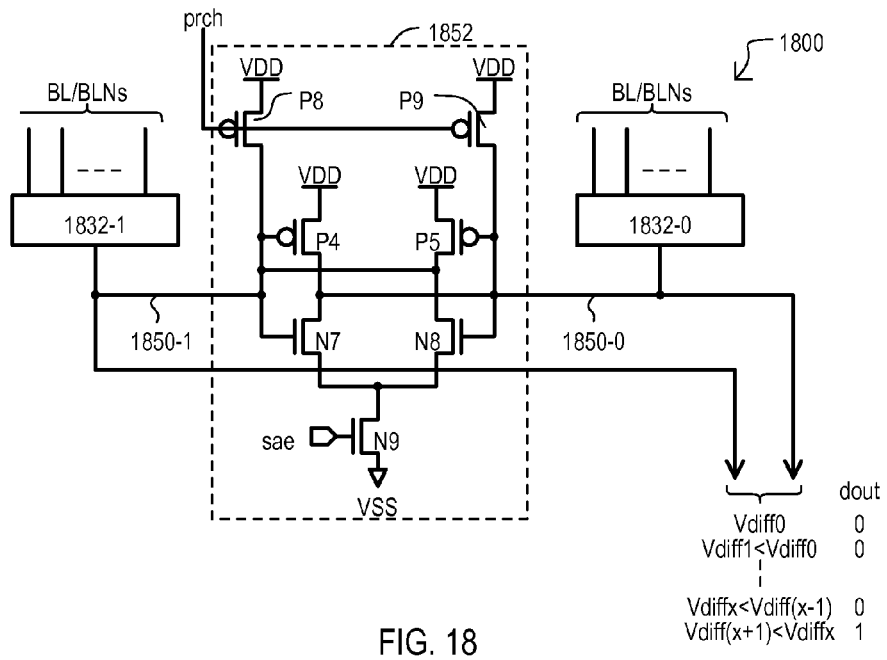
FIG. 18 is a block schematic diagram of an integrated circuit device according to a further embodiment.

FIG. 18 shows an IC device 1800 having a "regenerative" type SA 1852. IC device 1800 can include column select circuits 1832-0/1 which can couple bit lines (BL/BLNs) to sense nodes 1850-0/1 as described for embodiments herein, or equivalents. Sense nodes 1850-0/1 can be coupled to test outputs (not shown) via test elements (not shown). SA 1852 can include cross-coupled p-channel and n-channel transistors (P4/P5, N7/N8) and an enable transistor N9, as described for other embodiments. In addition, SA 1852 can include precharge transistors P8/P9.

An Offset test for IC device 1800 can start with precharge devices P8/P9 being disabled (prch=1). A reasonably large differential voltage can be generated across sense nodes 1850-0/1. SA 1852 can be activated (saen=0/1 pulse) to generate an output value. Such actions can be repeated with reduced differential values, as described for FIG. 15C until an output value changes. In alternative embodiments, a linear search or a binary search of the differential voltage can be performed to determine the offset voltage.

Figure 19:
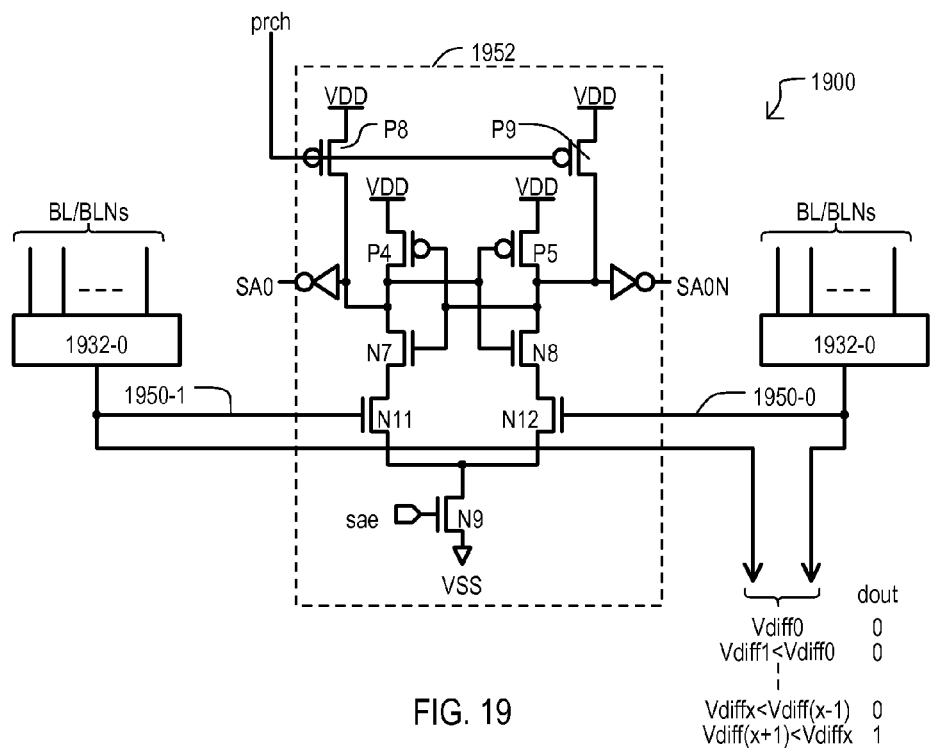
FIG. 19 is a block schematic diagram of an integrated circuit device according to another embodiment.

FIG. 19 shows an IC device 1900 having an analog comparator type SA 1952. IC device 1900 can include sections like those of FIGS. 18. In addition, SA 1952 can include differential input transistors N11/N12 having gates coupled to sense nodes 1950-0/1, and source-drain paths coupled between transistors N7/N8 and enable transistor N9.

An Offset test for IC device 1900 can occur in a like fashion to that of FIG. 18. Precharge devices P8/P9 can be disabled (prch=1), and a reasonably large differential voltage can be generated across sense nodes 1950-0/1. SA 1952 can be activated (saen=0/1 pulse) to generate an output value (SA0/SA0N). Such actions can be repeated with reduced differential values, as described for FIG. 15C until an output value changes.

Integrated circuit devices according to embodiments shown herein, and equivalents, may provide improved characterization of device elements by providing high fidelity test paths to various internal nodes of the device.

In very particular SRAM embodiments, transistors within individual memory cells can be characterized. In addition or alternatively, transistors within sense amplifiers and/or a sense amplifier offset voltage can be accurately characterized. Such data can enable circuits and threshold levels to be optimized to actual transistor response, as opposed to being constructed with "guard-band" responses designed to accommodate a wide range of variation in transistor and/or SA response.

In alternative embodiments, the test elements 102 can be used for measurement and characterization of analog circuits, such as a comparator in a flash analog to digital converter. Thus, the various embodiments and test operation described above can also be used to determine as-fabricated offsets in such analog circuits.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory circuit device having at least one test element interconnecting memory sections, the test element comprising:
    at least one first switch coupled to a first memory section between a first node within a tested section and an intermediate node,
    a test switch coupled between the intermediate node and a forced voltage node, and
    a second switch coupled between the intermediate node and a second node; wherein
    the forced voltage node is selectively coupled to receive a forced voltage substantially the same as a voltage applied to the second node, and the second node is coupled to at least a second memory section.

2. The memory circuit device of claim 1, wherein:
    the test element is operable in a first mode, in which the at least one first switch is configured to provide a low impedance path and the test switch is configured to provide a high impedance path; and
    the test element is operable in a second mode, in which the at least one first switch is configured to provide a high impedance path and the test switch is configured to provide a low impedance path.

3. The memory circuit device of claim 1, wherein:
    the at least one first switch, test switch, and second switch each comprise transistors of different conductivity types having current paths arranged in parallel with one another.

4. The memory circuit device of claim 1, wherein:
    the at least one first switch, test switch, and second switch each comprise at least one transistor; and
    the test element fits within no more than three transistor pitches.

5. The memory circuit device of claim 1, wherein:
    the at least one first switch includes a plurality of first parallel switches, each first parallel switch being coupled between a node of the integrated circuit and the intermediate node;
    the test element is operable in a first mode in which the test switch is configured to provide a high impedance path, at least one of the parallel switches is configured to provide a low impedance path, and the first parallel switches other than the at least one parallel switch are configured to provide a high impedance path; and
    the test element is operable in a second mode in which the test switch is configured to provide a low impedance path and the first parallel switches are configured to provide high impedance states.

6. The memory circuit device of claim 1, wherein:
    the first memory section comprises a memory array;
    the test element is formed in a same integrated circuit substrate having the second memory section which comprises a plurality of conductive input/output (I/O) pads formed thereon for making electrical connections to the memory circuit device; and
    the forced voltage node is coupled to at least one of the I/O pads.

7. The memory circuit device of claim 1, further including:
    the first memory section comprises a memory array; and
    a column multiplexer (MUX) circuit coupled between the test element and a bit line of the memory array, the column MUX coupling the bit line to the test element in response to column address data.

8. The memory circuit device of claim 1, further including:
    the first memory section comprises a memory array;
    at least one sense amplifier configured to amplify electrical signals on a bit line of the memory array to generate read output data; and
    the test element further includes the at least one first switch coupled to the bit line via a sense amplifier input.

9. The memory circuit device of claim 1, further including:
    the first memory section comprises a memory array formed from a plurality of banks, each bank including a plurality of bit lines; wherein
    the test element is coupled to one of the bit lines and further to the second memory section having at least one bank input/output (I/O) node.

10. The memory circuit device of claim 9, wherein:
    each bank includes at least one test element coupled to the bit lines of the bank and a bank I/O node of the bank; and
    a bank select circuit configured to couple each bank I/O node to a common bank node.

11. The integrated circuit device of claim 2, further including:
    the first memory section comprises a memory array having a plurality of memory cells coupled to bit lines, each memory cell including
        a first pair of pull-up transistors cross-coupled between two storage nodes, and
        a pair of access transistors that coupled each storage node to a different bit line;
    a word line driver circuit coupled to enable the access transistors in a test mode; and
    the at least one test element includes
    a first test element configured to apply a test voltage on a first bit line to a control terminal of one of the pull-up transistors of the first pair through a first of the access transistors in the test mode, the first test elements configured to be operable in the first mode, and a second test element configured to enable a current drawn by the one pull-up transistor to flow through a second bit line and a second of the access transistors in the test mode, the second test element configured to be operable in the first mode.

12. The memory circuit device of claim 11, further including:
a memory cell that further includes a second pair of pull-down transistors, cross-coupled between the two storage nodes and source node; and
a source driver circuit that drives the source node to the test voltage in the test mode.

13. The memory circuit device of claim 1, wherein:
the first memory section comprises a memory array having
a memory cell coupled to a bit line, the memory cell including
a pair of pull-up transistors cross-coupled between two storage nodes,
a pair of latching transistors cross-coupled between the two storage nodes, and
a pair of access transistors that coupled each storage node to a different bit line;
a word line driver circuit coupled to apply a test voltage to the control terminals of the access transistors in a test mode; and
the at least one test element includes
a first test element configured to apply an enable voltage to a control terminal of a first of the pull-up transistors through a first bit line and a first of the access transistors in the test mode, the test element being operable in the first mode, and
a second test element configured to enable a current drawn by one of the latching transistors to flow a second bit line and a second of the access transistors in the test mode, the second test element configured to be operable in the first mode.

14. The memory circuit device of claim 1, wherein at least one of the first and second memory section comprises a static random access memory (SRAM) array.

15. An integrated circuit, comprising:
a plurality of memory sections, each including a plurality of memory cells; and
a plurality of test elements coupled between at least a first memory section and a second memory section, each test element including
at least one first switch coupled between a first node within the first memory section and an intermediate node,
a test switch coupled between the intermediate node and a forced voltage node, and
a second switch coupled between the intermediate node and a second node within the second memory section; wherein
the forced voltage node is selectively coupled to receive a forced voltage substantially the same as a voltage applied to the second node.

16. The memory circuit device of claim 15, wherein:
each memory section comprises bank; and
each test element has a first node coupled to bit lines of a first bank and a second node coupled to a second bank.

17. The memory circuit device of claim 15, wherein:
each memory section comprises bank having at least one bank input/output (I/O) node; and
each test element has a first node coupled to a bank I/O node.

18. A method of testing memory sections comprising a plurality of memory cells, comprising:
in a direct access mode
enabling a first signal path coupled between a first node of a first memory section and a second node of a second memory section, the first signal path including an intermediate node; and
in a low leakage cutoff mode,
enabling at least a second signal path between the first node and the second node,
disabling the first signal path between the first node and the intermediate node and between the intermediate node and the second node, and
driving the second node and the intermediate node to substantially a same test voltage.

19. The method of claim 18, wherein:
the first node is coupled to a bit line of a bank and the second node is coupled to a bank input/output (I/O) node.

20. The method of claim 18, wherein:
the first node is coupled to a bank input/output (I/O) node, the bank I/O node being coupled to bit lines by column select circuit.

* * * * *